(12) United States Patent
Burlingame

(10) Patent No.: US 9,456,277 B2
(45) Date of Patent: Sep. 27, 2016

(54) SYSTEMS, METHODS, AND APPARATUS TO FILTER AUDIO

(71) Applicant: Sonos, Inc, Santa Barbara, CA (US)

(72) Inventor: Gregory Burlingame, Woburn, MA (US)

(73) Assignee: Sonos, Inc., Santa Barbara, CA (US)

( * ) Notice: Subject to any disclaimer, the term of this patent is extended or adjusted under 35 U.S.C. 154(b) by 69 days.

(21) Appl. No.: 14/329,501

(22) Filed: Jul. 11, 2014

(65) Prior Publication Data

US 2014/0321669 A1 Oct. 30, 2014

Related U.S. Application Data

(63) Continuation of application No. 13/333,595, filed on Dec. 21, 2011, now Pat. No. 8,811,630.

(51) Int. Cl.
  *H04R 5/02* (2006.01)
  *H04R 3/04* (2006.01)
  (Continued)

(52) U.S. Cl.
  CPC .............. *H04R 3/04* (2013.01); *H03G 5/005* (2013.01); *H03G 5/165* (2013.01); *H03G 9/025* (2013.01); *H04R 29/007* (2013.01); *H04R 2227/005* (2013.01)

(58) Field of Classification Search
  CPC .......... H04R 5/02; H04R 23/00; H04R 3/12; H04R 2420/01; H04R 2420/03; H04R 1/02; G01P 15/00; H03K 17/94; H04M 1/00; H04M 9/00; H04B 1/38; G09G 5/00; G06F 17/00; G06F 1/16; G06F 1/1626; G06F 1/1688; G06F 1/1694; G06F 3/165; G06F 2200/1614; G08B 29/00
  USPC ........... 381/1, 300, 303, 304, 305, 306, 307, 381/311, 12, 80, 81, 85, 332, 333, 334, 91, 381/123, 122, 335, 336, 386–388, 37, 103, 381/111, 116, 117, 118, 86, 302; 348/794, 348/480, 482, 484, E5.122, E5.123, 348/E5.125, E5.13; 341/20–26; 361/681, 361/683; 345/156, 169, 173, 158; 353/15, 353/19; 700/94
  See application file for complete search history.

(56) References Cited

U.S. PATENT DOCUMENTS

| 4,823,391 A | 4/1989 | Schwartz |
| 4,995,778 A | 2/1991 | Brussel |

(Continued)

FOREIGN PATENT DOCUMENTS

| EP | 1133896 B1 | 8/2002 |
| EP | 1825713 B1 | 10/2012 |

(Continued)

OTHER PUBLICATIONS

The United States Patent and Trademark Office, "Notice of Allowance", issued in connection with U.S. Appl. No. 13/333,595, mailed on Apr. 11, 2014, 29 pages.

(Continued)

*Primary Examiner* — Leshui Zhang

(57) ABSTRACT

Systems, methods, and apparatus to filter audio are disclosed. An example method includes determining that an orientation of a playback device is one of (a) a first orientation and (b) a second orientation, the playback device including a first speaker and a second speaker and configuring the first speaker and the second speaker. In the example, configuring the first and second speakers includes, when the determined orientation is the first orientation, configuring a first audio filter to be applied to a first audio signal for the first speaker and configuring a second audio filter to be applied to a second audio signal for the second speaker. However, when the determined orientation is the second orientation, configuring the first and second speakers includes configuring a third audio filter to be applied to the first audio signal and the second audio signal.

22 Claims, 12 Drawing Sheets

(51) Int. Cl.
  *H03G 5/00*    (2006.01)
  *H03G 5/16*    (2006.01)
  *H03G 9/02*    (2006.01)
  *H04R 29/00*   (2006.01)

(56) References Cited

U.S. PATENT DOCUMENTS

| | | | |
|---|---|---|---|
| 5,910,991 A | 6/1999 | Farrar | |
| 7,072,477 B1 | 7/2006 | Kincaid | |
| 7,171,010 B2 | 1/2007 | Martin et al. | |
| 7,490,044 B2 | 2/2009 | Kulkarni | |
| 7,519,188 B2 | 4/2009 | Berardi et al. | |
| 7,630,500 B1 | 12/2009 | Beckman et al. | |
| 8,063,698 B2 | 11/2011 | Howard | |
| 8,139,774 B2 | 3/2012 | Berardi et al. | |
| 8,160,281 B2 | 4/2012 | Kim et al. | |
| 8,175,292 B2 | 5/2012 | Aylward et al. | |
| 8,229,125 B2 | 7/2012 | Short | |
| 8,233,632 B1 | 7/2012 | Macdonald et al. | |
| 8,238,578 B2 | 8/2012 | Aylward | |
| 8,243,961 B1 | 8/2012 | Morrill | |
| 8,265,310 B2 | 9/2012 | Berardi et al. | |
| 8,290,185 B2 | 10/2012 | Kim | |
| 8,306,235 B2 | 11/2012 | Mahowald | |
| 8,325,935 B2 | 12/2012 | Rutschman | |
| 8,331,585 B2 | 12/2012 | Hagen et al. | |
| 8,391,501 B2 | 3/2013 | Khawand et al. | |
| 8,452,020 B2 | 5/2013 | Gregg et al. | |
| 8,577,045 B2 | 11/2013 | Gibbs | |
| 8,600,075 B2 | 12/2013 | Lim | |
| 8,620,006 B2 | 12/2013 | Berardi et al. | |
| 8,855,319 B2 | 10/2014 | Liu et al. | |
| 8,879,761 B2 | 11/2014 | Johnson et al. | |
| 8,914,559 B2 | 12/2014 | Kalayjian et al. | |
| 8,934,647 B2 | 1/2015 | Joyce et al. | |
| 8,934,655 B2 | 1/2015 | Breen et al. | |
| 8,965,546 B2 | 2/2015 | Visser et al. | |
| 8,977,974 B2 | 3/2015 | Kraut | |
| 8,984,442 B2 | 3/2015 | Pirnack et al. | |
| 9,020,153 B2 | 4/2015 | Britt, Jr. | |
| 2006/0159286 A1* | 7/2006 | Stiles | H04R 1/26 381/111 |
| 2010/0142735 A1 | 6/2010 | Yoon et al. | |
| 2011/0044476 A1 | 2/2011 | Burlingame et al. | |
| 2011/0170710 A1 | 7/2011 | Son | |
| 2012/0051558 A1 | 3/2012 | Kim et al. | |
| 2012/0051567 A1* | 3/2012 | Castor-Perry | H04R 29/002 381/304 |
| 2012/0127831 A1 | 5/2012 | Gicklhorn et al. | |
| 2012/0263325 A1 | 10/2012 | Freeman et al. | |
| 2013/0010970 A1 | 1/2013 | Hegarty et al. | |
| 2013/0028443 A1 | 1/2013 | Pance et al. | |
| 2013/0163783 A1 | 6/2013 | Burlingame | |
| 2013/0259254 A1 | 10/2013 | Xiang et al. | |
| 2014/0016784 A1 | 1/2014 | Sen et al. | |
| 2014/0016786 A1 | 1/2014 | Sen | |
| 2014/0016802 A1 | 1/2014 | Sen | |
| 2014/0023196 A1 | 1/2014 | Xiang et al. | |
| 2014/0112481 A1 | 4/2014 | Li et al. | |
| 2014/0219456 A1 | 8/2014 | Morrell et al. | |
| 2014/0226823 A1 | 8/2014 | Sen et al. | |
| 2014/0294200 A1 | 10/2014 | Baumgarte et al. | |
| 2014/0355768 A1 | 12/2014 | Sen et al. | |
| 2014/0355794 A1 | 12/2014 | Morrell et al. | |
| 2015/0063610 A1 | 3/2015 | Mossner | |
| 2015/0146886 A1 | 5/2015 | Baumgarte | |
| 2015/0201274 A1 | 7/2015 | Ellner et al. | |
| 2015/0281866 A1 | 10/2015 | Williams et al. | |

FOREIGN PATENT DOCUMENTS

| | | |
|---|---|---|
| EP | 2860992 A1 | 4/2015 |
| JP | 2008211438 A * | 9/2008 |
| WO | 2015024881 A1 | 2/2015 |

OTHER PUBLICATIONS

The United States Patent and Trademark Office, "Non-Final Office action", issued in connection with U.S. Appl. No. 13/333,595, mailed on Jan. 2, 2014, 25 pages.

* cited by examiner

SYSTEMS, METHODS, AND APPARATUS TO FILTER AUDIO

CROSS-REFERENCE TO RELATED APPLICATION

The present application claims the benefit of and priority to U.S. patent application Ser. No. 13/333,595, filed on Dec. 21, 2011, for "SYSTEMS, METHODS, AND APPARATUS TO FILTER AUDIO", which is herein incorporated by reference in its entirety for all purposes.

FIELD OF THE DISCLOSURE

The disclosure is related to consumer electronics and, more particularly, to systems, methods, and apparatus to filter audio.

BACKGROUND

Audio filter circuits and digital audio filtering are used to achieve desired effects by modifying an audio signal prior to outputting the audio signal via a speaker. Example uses include attenuating certain frequencies of the signal to reduce or eliminate undesired background noises or amplifying frequencies of the signal to emphasize particular elements of the audio signal. Such audio filtering, or equalization (EQ), can affect how the audio is perceived by a listener.

BRIEF DESCRIPTION OF THE DRAWINGS

Features, aspects, and advantages of the presently disclosed technology are better understood with regard to the following description, appended claims, and accompanying drawings where:

Figure 1:
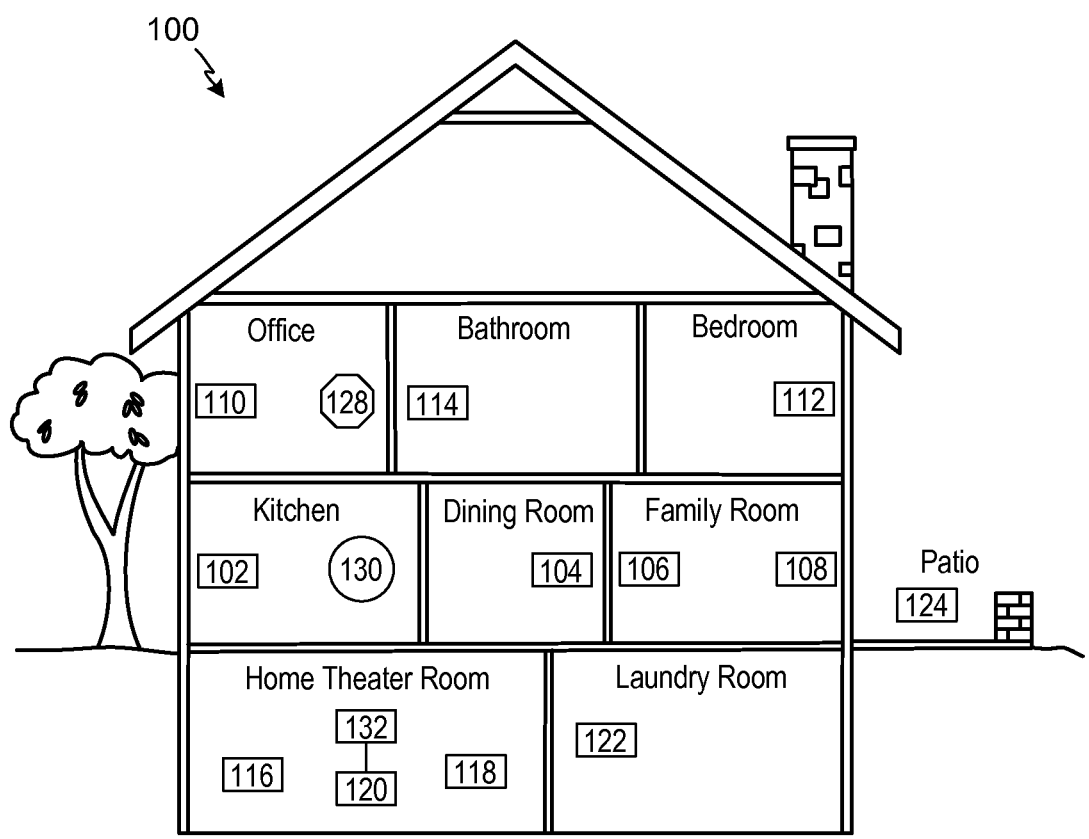
FIG. 1 shows an illustration of an example system in which embodiments of the methods and apparatus disclosed herein can be implemented.

In addition, the drawings are for the purpose of illustrating example embodiments, but it is understood that the present disclosure is not limited to the arrangements and instrumentality shown in the drawings.

DETAILED DESCRIPTION

I. Overview

Example systems, methods, and apparatus to filter audio are disclosed herein. In some examples, an audio filtering circuit such as a digital audio processor filters audio to a mid-tweeter-mid (MTM) speaker configuration to reduce or eliminate a narrowing phenomenon normally experienced using such a configuration. Example systems, methods, and/or apparatus disclosed herein also provide MTM speaker configurations that can be used in different orientations (e.g., vertical and horizontal), where the filtering applied to the audio signals may be different based on the orientation of the speakers. The example systems, methods, and/or apparatus disclosed herein may be used in combination with a multiple-speaker configuration in which the speakers included in the configuration share one or more sources of audio information and play the audio in synchrony.

Some example systems, methods, and/or apparatus provide first filtering to an audio signal to be output from a first mid-range speaker of an MTM configuration and provide second filtering to an audio signal to be output from a second mid-range speaker of the MTM configuration to reduce or eliminate the narrowing effect and generally improve (e.g., objectively and subjectively) the audio consistency between different physical locations. Accordingly, such example systems, methods, and/or apparatus provide MTM speaker configurations that are highly flexible in terms of types of uses by providing improved audio output quality in different orientations. This flexibility allows for potentially increased aesthetics and flexibility in placing the speakers for different uses.

An example embodiment of apparatus implemented in accordance with the present disclosure includes first and second audio speakers having first audio characteristics, a third audio speaker having second audio characteristics, wherein the third speaker is positioned between the first and second audio speakers, a first audio filter to process an audio input signal to have a first frequency response including a first cutoff frequency, the first audio filter to output a first audio output signal to the first audio speaker, and a second audio filter to process the audio input signal to have a second frequency response to compensate for interference between the first and second frequency responses caused by a position of the first audio speaker relative to the second audio speaker.

In some embodiments, the first, second, and third audio speakers include a mid-tweeter-mid speaker arrangement, the second audio filter to have a second cutoff frequency greater than the first cutoff frequency when the mid-tweeter-mid speaker arrangement is oriented horizontally. Some example apparatus include a digital audio processor to implement the first and second audio filters.

In some embodiments, the first audio filter includes a low-frequency shelf filter, a bandpass shelf filter, and a low-pass filter having the first cutoff frequency. In some embodiments, the second audio filter includes a low-frequency shelf filter, a bandpass shelf filter, a low-pass filter having the second cutoff frequency, an allpass filter, and high-frequency shelf filter. In some such embodiments, the allpass filter applies a −360 degree phase shift to the audio input signal or to a filtered signal based on the audio input signal. Some embodiments of an apparatus also include an orientation detector to determine whether the first, second, and third speakers are in a first orientation or a second orientation, where the second audio filter is to apply the allpass filter and high-frequency shelf filter when the first, second, and third speakers are in the first orientation and is to omit the allpass filter and the high-frequency shelf filter when the first, second, and third speakers are in the second orientation.

In some embodiments, the apparatus further includes a network interface to receive at least one of the input audio signal, a synchronization signal associated with a multiple-device arrangement, or a configuration signal associated with a multiple-device arrangement. In some such embodiments, the second speaker is to be positioned on the outside when in a multiple-device configuration.

Another example apparatus implemented in accordance with the present disclosure includes first and second audio speakers having first audio characteristics, a third audio speaker having second audio characteristics, wherein the first, second, and third speakers are arranged in a mid-tweeter-mid (MTM) configuration, and a digital audio processor to filter an audio signal to cause first audio output from the first audio speaker to have a dominant frequency response in a first frequency range relative to the second audio output from the second audio speaker.

In some embodiments, the digital audio filter is to filter the audio signal to cause the first audio output to have a −360 degree lag relative to the second audio output. In some embodiments, the first frequency range is between a cutoff frequency of the second audio output and a crossover frequency.

In some embodiments, the first frequency range is based on a spacing between the first and second audio speakers. In some embodiments, the digital audio filter is to cause the first audio output and the second audio output to have a substantially equal frequency response when the first, second, and third speakers are in a second orientation.

In some embodiments, the apparatus further includes a network interface to synchronize the first and second audio output with another audio device. In some such embodiments, the network interface is to receive at least one of the audio signal or a user input.

An example method implemented in accordance with the disclosure includes applying a first mid-range filter of a mid-tweeter-mid speaker arrangement to a first audio signal, applying a second mid-range filter different from the first mid-range filter to a second audio signal to compensate for interference caused by a position of a first mid-range speaker in the mid-tweeter-mid speaker arrangement relative to a second mid-range speaker in the mid-tweeter-mid speaker arrangement, and outputting a filtered audio signal from the second mid-range filter via the second mid-range speaker.

In some embodiments, the method further includes determining a configuration of the mid-tweeter-mid speaker arrangement in a multiple-device arrangement, wherein applying the second mid-range filter is based on the configuration. In some such embodiments, applying the second mid-range filter includes providing an output audio signal filtered using the second mid-range filter to an outermost mid-range speaker of the mid-tweeter-mid speaker arrangement in the multiple-device arrangement.

In some embodiments, a second frequency response of the second mid-range filter has a higher cutoff frequency than a first frequency response of the first mid-range filter.

Although the following discloses example systems, methods, and apparatus including, among other components, firmware and/or software executed on hardware, it should be noted that such systems, methods, and/or apparatus are merely illustrative and should not be considered as limiting. For example, it is contemplated that any or all of these firmware, hardware, and/or software components could be embodied exclusively in hardware, exclusively in software, exclusively in firmware, or in any combination of hardware, software, and/or firmware. Accordingly, while the following describes example systems, methods, and/or apparatus, the examples provided are not the only way(s) to implement such systems, methods, and/or apparatus.

When any of the appended claims are read to cover a purely software and/or firmware implementation, at least one of the elements in at least one example is hereby expressly defined to include a tangible medium such as a memory, digital versatile disk (DVD), compact disc (CD), Blu-ray, and so on, storing the software and/or firmware.

These embodiments and many additional embodiments are described more below. Further, the detailed description is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments.

Reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

II. Example Environment

Referring now to the drawings, in which like numerals can refer to like parts throughout the figures, FIG. 1 shows an example system configuration 100 in which one or more of the method and/or apparatus disclosed herein can be practiced or implemented. By way of illustration, the system configuration 100 represents a home with multiple zones. Each zone, for example, represents a different room or space, such as an office, bathroom, bedroom, kitchen, dining room, family room, home theater room, utility or laundry room, and patio. While not shown here, a single zone can cover more than one room or space. One or more of zone players 102-124 are shown in each respective zone. A zone player 102-124, also referred to as a playback device, multimedia unit, speaker, and so on, provides audio, video, and/or audiovisual output. A controller 130 (e.g., shown in the kitchen for purposes of illustration) provides control to the system configuration 100. The system configuration 100 illustrates an example whole house audio system, though it is understood that the technology described herein is not limited to its particular place of application or to an expansive system like a whole house audio system 100 of FIG. 1.

Figure 2A:
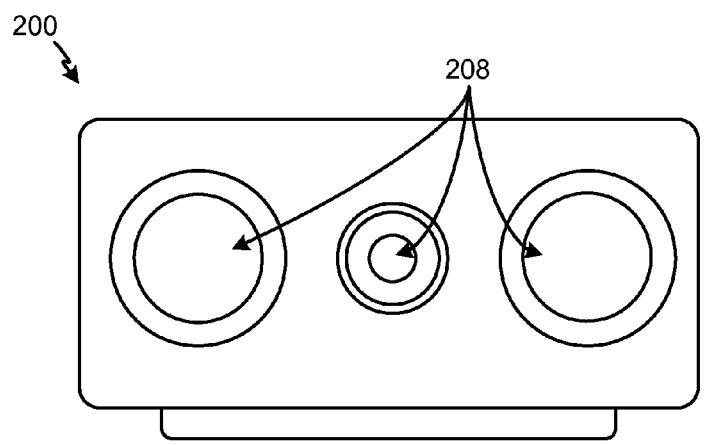
FIG. 2A shows an illustration of an example zone player having a built-in amplifier and speakers.
Figure 2B:
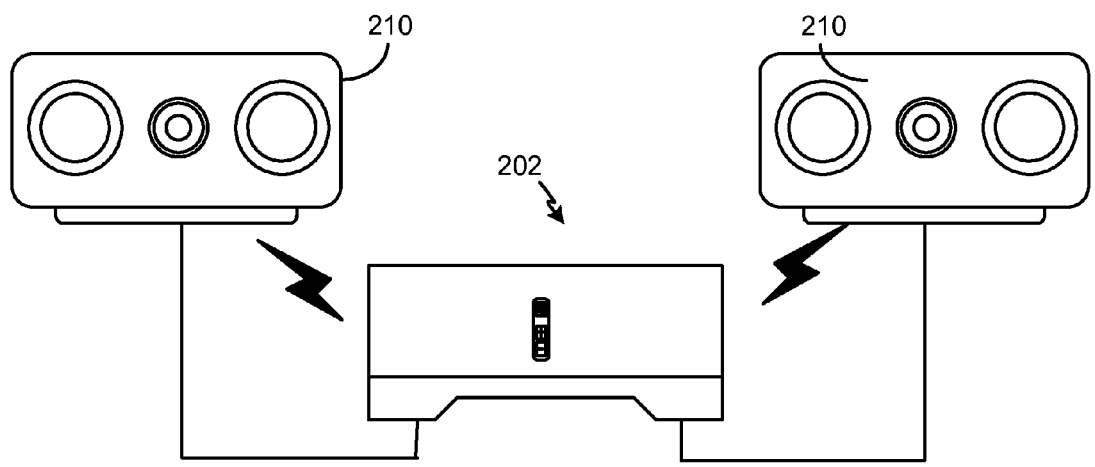
FIG. 2B shows an illustration of an example zone player having a built-in amplifier and connected to external speakers.
Figure 2C:
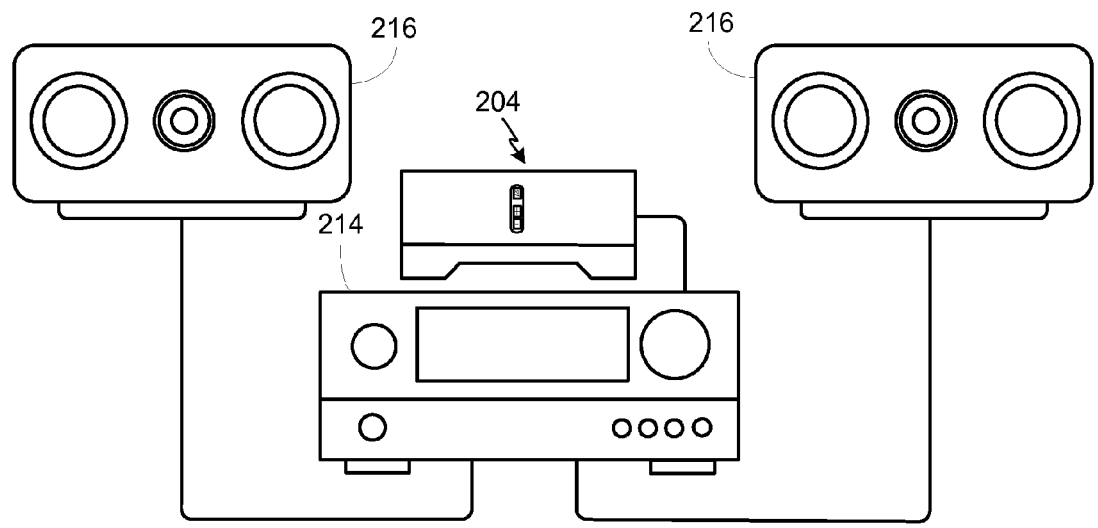
FIG. 2C shows an illustration of an example zone player connected to an A/V receiver and speakers.

FIGS. 2A, 2B, and 2C show example illustrations of zone players 200-204. The zone players 200-204 of FIGS. 2A, 2B, and 2C, respectively, can correspond to any of the zone players 102-124 of FIG. 1. While certain embodiments provide multiple zone players, an audio output can be generated using only a single zone player. FIG. 2A illustrates a zone player 200 including sound producing equipment 208 capable of generating sound or an audio output corresponding to a signal received (e.g., wirelessly and/or via a wired interface). The sound producing equipment 208 of the zone player 200 of FIG. 2A includes a built-in amplifier (not shown in this illustration) and speakers (e.g., a tweeter and two mid-range speakers). In certain embodiments, the zone player 200 of FIG. 2A can be configured to play stereophonic audio or monaural audio. In some embodiments, the zone player 200 of FIG. 2A can be configured as a component in a combination of zone players to play stereophonic audio, monaural audio, and/or surround audio. As described in greater detail below, in some embodiments, the example zone player 200 of FIG. 2A can also transmit a second signal to, for example, other zone player(s) in the same or different zone(s), speaker(s), receiver(s), and so on. Transmission of the second signal can be part of, for example, a system in which multiple zone players, speakers, receivers, and so on, form a network to, for example, present media content in a synchronization or distributed manner.

The example zone player 202 of FIG. 2B includes a built-in amplifier (not shown in this illustration) to power a set of detached speakers 210. The speakers 210 of FIG. 2B can include, for example, any type of loudspeaker. The zone player 202 of FIG. 2B can communicate a signal corresponding to audio content to the detached speakers 210 via wired and/or wireless channels. Instead of receiving and generating audio content as in FIG. 2A, the zone player 202 of FIG. 2B receives the audio content and transmits the same (e.g., after processing the received signal) to the detached speakers 210. Similar to the example zone player 200 of FIG. 2A, in some embodiments the zone player 202 can transmit a second signal to, for example, other zone player(s) in the same or different zone(s), speaker(s), receiver(s), and so on.

The example zone player 204 of FIG. 2C does not include an amplifier, but allows a receiver 214, or another audio and/or video type device with built-in amplification, to connect to a data network 128 of FIG. 1 and to play audio received over the data network 128 via the receiver 214 and a set of detached speakers 216. In addition to the wired couplings shown in FIG. 2C, the detached speakers 216 can receive audio content via a wireless communication channel between the detached speakers 216 and, for example, the zone player 204 and/or the receiver 214. In some embodiments the zone player 202 can transmit a second signal to, for example, other zone player(s) in the same or different zone(s), speaker(s), receiver(s), and so on.

Example zone players include a "Sonos Play:3," "ZonePlayer® 120," and "ZonePlayer® 90," which are offered by Sonos, Inc. of Santa Barbara, Calif. Any other past, present, and/or future zone players can additionally or alternatively be used to implement the zone players of example embodiments disclosed herein. A zone player can also be referred to herein as a playback device, and a zone player is not limited to the particular examples illustrated in FIGS. 2A, 2B, and 2C. For example, a zone player can include a wired or wireless headphone. In other examples, a zone player might include a subwoofer. In yet other examples, a zone player can include a sound bar. In an example, a zone player can include or interact with a docking station for an Apple iPod™ or similar device. In some embodiments, a zone player can relay one or more signals received from, for example, a first zone player to another playback device. In some embodiments, a zone player can receive a first signal and generate an output corresponding to the first signal and, simultaneously or separately, can receive a second signal and transmit or relay the second signal to another zone player(s), speaker(s), receiver(s), and so on. Thus, an example zone player described herein can act as a playback device and, at the same time, operate as a hub in a network of zone players. In such instances, media content corresponding to the first signal can be different from the media content corresponding to the second signal.

Figure 3:
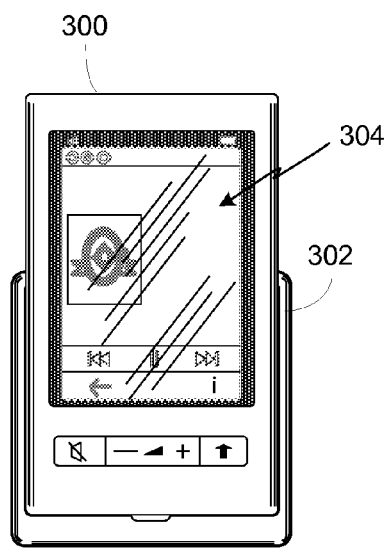
FIG. 3 shows an illustration of an example controller.

FIG. 3 shows an example illustration of a wireless controller 300 in a docking station 302. The controller 300 can correspond to the controlling device 130 of FIG. 1. The controller 300 is provided with a touch screen 304 that allows a user to interact with the controller 300, for example, to retrieve and navigate a playlist of audio items, control operations of one or more zone players, and provide overall control of the system configuration 100. In some examples, the wireless controller 300 may be used to group zone players into stereo and/or other multiple-device configurations. In certain embodiments, any number of controllers can be used to control the system configuration 100. In certain embodiments, there can be a limit on the number of controllers that can control the system configuration 100. The controllers might be wireless like wireless controller 300 or wired to the data network 128. Furthermore, an application running on any network-enabled portable devices, such as an iPhone™, iPad™, Android™ powered phone, or any other smart phone or network-enabled device can be used as a controller by connecting to the data network 128. An application running on a laptop or desktop PC or Mac can also be used as a controller. Example controllers include a "Sonos® Controller 200," "Sonos® Controller for iPhone," "Sonos® Controller for iPad," "Sonos® Controller for Android, "Sonos® Controller for Mac or PC," which are offered by Sonos, Inc. of Santa Barbara, Calif. The flexibility of such an application and its ability to be ported to a new type of portable device is advantageous.

Referring back to the system configuration 100 of FIG. 1, a particular zone can contain one or more zone players. For example, the family room of FIG. 1 contains two zone players 106 and 108, while the kitchen is shown with one zone player 102. Zones can be dynamically configured by positioning a zone player in a room or space and assigning via the controller 130 the zone player to a new or existing zone. As such, zones can be created, combined with another zone, removed, and given a specific name (e.g., "Kitchen"), if so programmed. The zone players 102 to 124 are coupled directly or indirectly to a data network, such as the data network 128 shown in FIG. 1. The data network 128 is represented by an octagon in the figure to stand out from other components shown in the figure. While the data network 128 is shown in a single location, it is understood that such a network can be distributed in and around the system configuration 100.

Particularly, the data network 128 can be a wired network, a wireless network, or a combination of both. In some embodiments, one or more of the zone players 102-124 are wirelessly coupled to the data network 128 based on a proprietary mesh network. In some embodiments, one or more of the zone players 102-124 are wirelessly coupled to the data network 128 using a non-mesh topology. In some embodiments, one or more of the zone players 102-124 are coupled via a wire to the data network 128 using Ethernet or similar technology. In addition to the one or more zone players 102-124 connecting to the data network 128, the data network 128 can further allow access to a wide area network, such as the Internet.

In certain embodiments, the data network 128 can be created by connecting any of the zone players 102-124, or some other connecting device, to a broadband router. Other zone players 102-124 can then be added wired or wirelessly to the data network 128. For example, a zone player (e.g., any of zone players 102-124) can be added to the system configuration 100 by simply pressing a button on the zone player itself, which enables a connection to be made to the data network 128. The broadband router can be connected to an Internet Service Provider (ISP), for example The broadband router can be used to form another data network within the system configuration 100, which can be used in other applications (e.g., web surfing). The data network 128 can also be used in other applications, if so programmed. Further, in certain embodiments, the data network 128 is the same network used for other applications in the household.

In certain embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly listening to the audio. Further, zones can be put into a "party mode" such that all associated zones will play audio in synchrony.

In certain embodiments, a zone contains two or more zone players. For example, the family room contains two zone players 106 and 108, and the home theater room contains at least zone players 116, 118, and 120. A zone can be configured to contain as many zone players as desired, and for example, the home theater room might contain additional zone players to play audio from a 5.1 channel or greater audio source (e.g., a movie encoded with 5.1 or greater audio channels). If a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players can play audio in synchrony with other zone players.

In certain embodiments, three or more zone players can be configured to play various channels of audio that is encoded with three channels or more sound. For example, the home theater room shows zone players 116, 118, and 120. If the sound is encoded as 2.1 channel audio, then the zone player 116 can be configured to play left channel audio, the zone player 118 can be configured to play right channel audio, and the zone player 120 can be configured to play bass frequencies. Other configurations are possible and depend on the number of zone players and the type of audio. Further, a particular zone can be configured to play a 5.1 channel audio in one instance, such as when playing audio from a movie, and then dynamically switch to play stereo, such as when playing audio from a two channel source.

In certain embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device is preferably set in a consolidated mode.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and reconnecting speaker wire, for example, to individual, discrete speakers to create different configurations. As such, certain embodiments described herein provide a more flexible and dynamic platform through which sound reproduction can be offered to the end-user.

Sources of audio content to be played by zone players 102-124 are numerous. Music from a personal library stored on a computer or networked-attached storage (NAS) can be accessed via the data network 128 and played. Internet radio stations, shows, and podcasts can be accessed via the data network 128. Music services that let a user stream and download music and audio content can be accessed via the data network 128. Further, music can be obtained from traditional sources, such as a turntable or CD player, via a line-in connection to a zone player, for example. Audio content can also be accessed through AirPlay™ wireless technology by Apple, Inc., for example. Audio content received from one or more sources can be shared amongst the zone players 102 to 124 via the data network 128 and/or the controller 130. The above-disclosed sources of audio content are referred to herein as network-based audio information sources. However, network-based audio information sources are not limited thereto.

III. Example Playback Device

Figure 4:
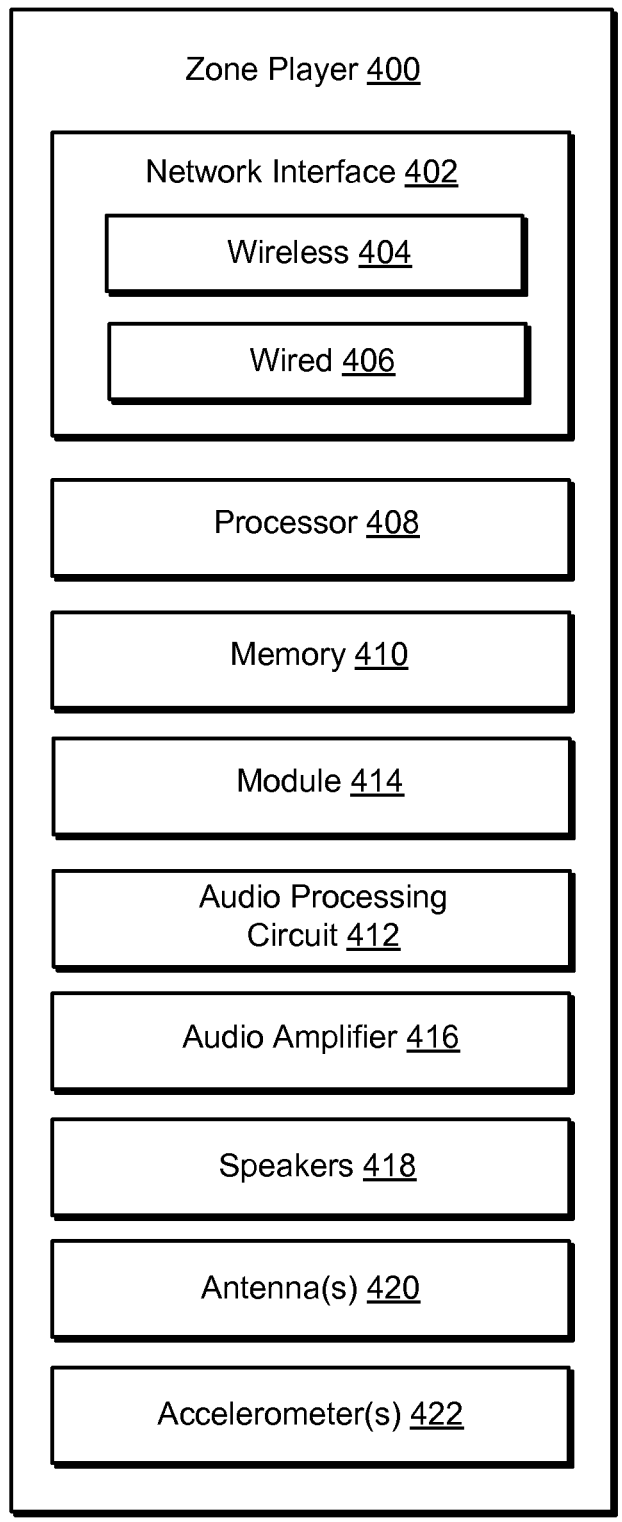
FIG. 4 shows an internal functional block diagram of an example zone player.

Referring now to FIG. 4, there is shown an example functional block diagram of a zone player 400 in accordance with an embodiment. The zone player 400 of FIG. 4 includes a network interface 402, a processor 408, a memory 410, an audio processing component 412, a module 414, an audio amplifier 416, and a speaker unit 418 coupled to the audio amplifier 416. FIG. 2A shows an example illustration of such a zone player. Other types of zone players can not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a lamp for indoor or outdoor use.

Referring back to FIG. 4, the network interface 402 facilitates a data flow between zone players and other devices on a data network (e.g., the data network 128 of FIG. 1) and the zone player 400. In some embodiments, the network interface 402 can manage the assembling of an audio source or file into smaller packets that are to be transmitted over the data network or reassembles received packets into the original source or file. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, the network interface 402 can include one or both of a wireless interface 404 and a wired interface 406. The wireless interface 404, also referred to as an RF interface, provides network interface functions for the zone player 400 to wirelessly communicate with other devices (e.g., other zone player(s), speaker(s), receiver(s), component(s) associated with the data network 128, and so on) in accordance with a communication protocol (e.g., any of the wireless standards IEEE 802.11a, 802.11b, 802.11g, 802.11n, or 802.15). To receive wireless signals and to provide the wireless signals to the wireless interface 404 and to transmit wireless signals, the zone player 400 of FIG. 4 includes one or more antennas 420. The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software modules 414, which can be executed by the processor 408 to achieve certain tasks. In the illustrated embodiment, the memory 410 is a tangible machine readable medium storing instructions that can be executed by the processor 408. In some embodiments, a task might be for the zone player 400 to retrieve audio data from another zone player or a device on a network. In some embodiments, a task might be for the zone player 400 to send audio data to another zone player or device on a network. In some embodiments, a task might be for the zone player 400 to synchronize playback of audio with one or more additional zone players. In some embodiments, a task might be to pair the zone player 400 with one or more zone players to create a multi-channel audio environment. Additional or alternative tasks can be achieved via the one or more software modules 414 and the processor 408.

The audio processing component 412 can include one or more digital-to-analog converters (DAC), an audio preprocessing component, an audio enhancement component or a digital signal processor, and so on. In certain embodiments, the audio that is retrieved via the network interface 402 is processed and/or intentionally altered by the audio processing component 412. In some examples, the audio processing component 412 filters audio signals differently for different speakers 418. Further, the audio processing component 412 can produce analog audio signals. The processed analog audio signals are then provided to the audio amplifier 416 for play back through speakers 418. In addition, the audio processing component 412 can include necessary circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (for low frequencies), a mid-range driver (middle frequencies), and a tweeter (high frequencies), for example. An enclosure can be sealed or ported, for example.

A zone player 400 can also be referred to herein as a playback device. An example playback device includes a Sonos® Play:3, which is manufactured by Sonos, Inc. of Santa Barbara, Calif. The Play:3 is an example zone player with a built-in amplifier and speakers. In particular, the Play:3 is a three-driver speaker system that includes a tweeter and two mid-range speakers (also referred to as drivers). When playing audio content via the Play:3, the left audio data of a track is output from the left mid-range speaker, the right audio data of a track is output from the right mid-range driver, and the tweeter outputs center or both left and right audio data for a track. Audio from Internet radio stations, online music and video services, downloaded music, analog audio inputs, television, DVD, and so on, can be played from a Sonos® Play:3. While the Play:3 is an example of a zone player with speakers, it is understood that a zone player with speakers is not limited to one with a certain number of speakers (e.g., three speakers as in the Play:3), but rather can contain one or more speakers. Further, a zone player can be part of another device, which might even serve a purpose different than audio (e.g., a lamp).

IV. Example Controller

Figure 5:
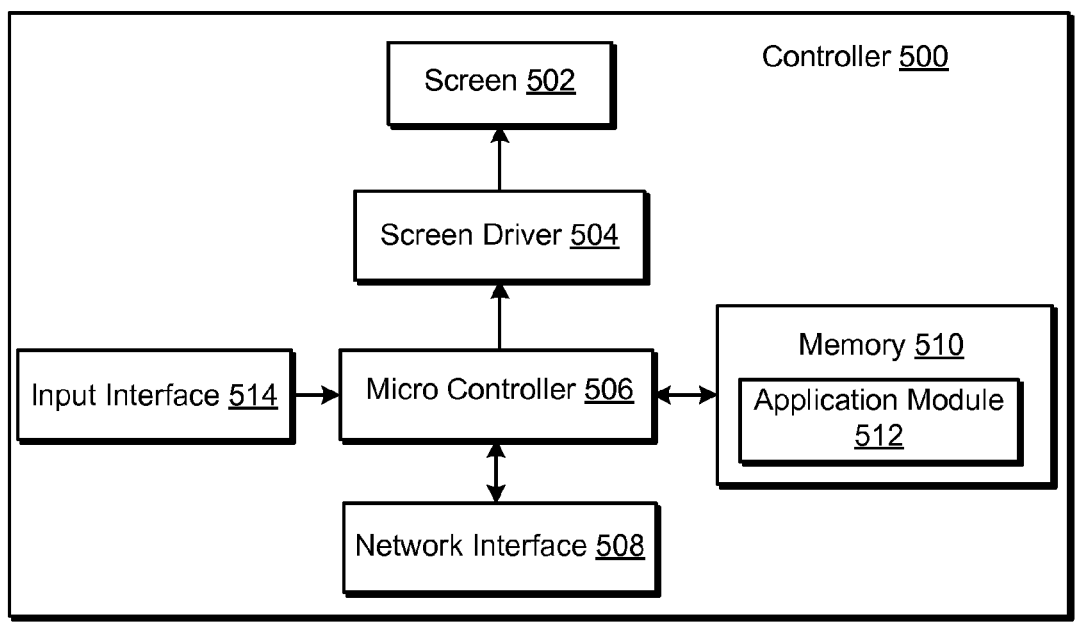
FIG. 5 shows an internal functional block diagram of an example controller.

Referring now to FIG. 5, there is shown an example controller 500, which can correspond to the controlling device 130 in FIG. 1. The controller 500 can be used to facilitate the control of multi-media applications, automation and others in a system. In particular, the controller 500 is configured to facilitate a selection of a plurality of audio sources available on the network and enable control of one or more zone players (e.g., the zone players 102-124 in FIG. 1) through a wireless network interface 508. According to one embodiment, the wireless communications is based on an industry standard (e.g., infrared, radio, wireless standards IEEE 802.11a, 802.11b 802.11g, 802.11, or 802.15). Further, when a particular audio is being accessed via the controller 500 or being played via a zone player, a picture (e.g., album art) or any other data, associated with the audio source can be transmitted from a zone player or other electronic device to the controller 500 for display.

The controller 500 is provided with a screen 502 and an input interface 514 that allows a user to interact with the controller 500, for example, to navigate a playlist of many multimedia items and to control operations of one or more zone players. The screen 502 on the controller 500 can be a liquid crystal display (LCD) screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system. Further, a controller can be integrated into a zone player.

It should be noted that other network-enabled devices such as an iPhone®, iPad® or any other smart phone or network-enabled device (e.g., a networked computer such as a PC or Mac®) can also be used as a controller to interact or control zone players in a particular environment. In some embodiments, a software application or upgrade can be downloaded onto a network enabled device to perform the functions described herein.

In some embodiments, a user can create a zone group including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups could be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In some embodiments, a user can link any number of the six zone players, for example, by starting with a single zone and then manually linking each zone to that zone.

In some embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would need to manually and individually link each zone. The single command might include a mouse click, a double mouse click, a button press, a gesture, or some other programmed action. Other kinds of zone scenes can be programmed.

In some embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

Figure 6:
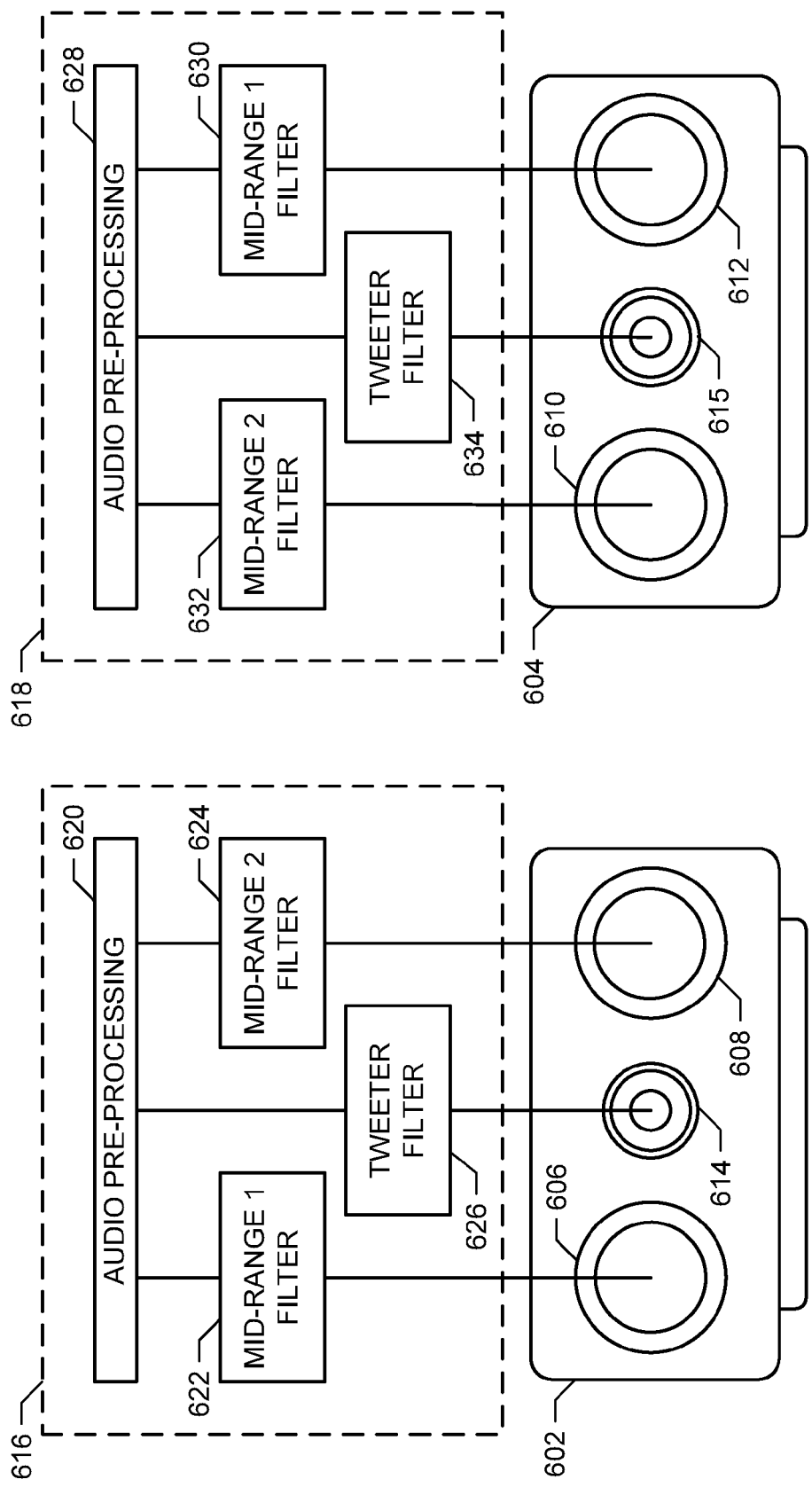
FIG. 6 shows an example pair of zone players having mid-tweeter-mid (MTM) speaker arrangements, including audio filters, and configured as a stereo pair.

FIG. 6 shows an example pair of zone players 602, 604 having mid-tweeter-mid (MTM) speaker arrangements, including audio filters, and configured as a stereo pair. Either of the example zone players 602, 604 may be implemented by the zone player 400 of FIG. 4. In particular, each of the example zone players 602, 604 includes an audio processing circuit (e.g., the audio processing circuit 412 of FIG. 4) to implement a set of audio filters, and a plurality of speakers (e.g., the speakers 418 of FIG. 4) to implement a corresponding set of speakers or audio reproduction devices.

An MTM speaker arrangement includes two mid-range speakers 606, 608, 610, 612 (e.g., speakers having a diameter between about 3.5 inches and 6.75 inches, operating in the approximate frequency range of 300-5000 Hz) and a high-range speaker, also known as a tweeter 614, 615 (e.g., 3.5 inch diameter or smaller, operating in the approximate frequency range of 2,000-20,000 Hz) per zone player 602, 604. The example zone players 602, 604 of FIG. 6 may be oriented horizontally, where the centers of the mid-range speakers are substantially level in a horizontal direction, and/or vertically, where the centers of the midrange speakers are substantially aligned in a vertical direction. The example mid-range speakers 606, 608 are spaced such that the centers of the speakers 606, 608 are approximately one-half wavelength of a selected center frequency (e.g., $\lambda 0/2$) apart. An example center frequency $\lambda 0$ that may be used to determine the spacing of the example pairs of mid-range speakers 606, 608 and 610, 612 is 1,000 Hz, which has a wavelength of about 344 millimeters (e.g., at sea level at about 20 degrees Celsius). The example tweeter 614 is positioned between the example mid-range speakers 606, 608.

The example zone players 602, 604 include respective audio filters 616, 618. As mentioned above, the example audio filters 616, 618 may be implemented using digital audio processing circuitry, such as a digital audio processor or other digital processing unit. The following example will be described with reference to the example audio filter 616 of FIG. 6. However, the description of the audio filter 616 is also applicable to the example audio filter 618. The operation of the example zone players 602, 604 as a stereo pair with respect to the audio filters 616, 618 is also discussed below. The example zone players 602, 604 may also be operated in other multiple-device arrangements. As used herein "multiple-device" refers to separate sets of speakers, such as multiple-MTM speaker arrangements, and not merely multiple speakers in the same device.

The example audio filter 616 of FIG. 6 is an active filter, which filters the received audio information prior to amplification. The example audio filter 616 includes an audio preprocessing block 620, a first mid-range filter 622, a second mid-range filter 624, and a tweeter filter 626. The example audio preprocessing block 620 may include, for example, audio decoding to decompress and/or otherwise convert an audio information (e.g., an audio file) from a storage format (e.g., compressed) to audio information in a playback format. The audio pre-processing block 620 provides the audio information to the example filters 622-626 for processing.

Some MTM speaker arrangements experience a "narrowing" phenomenon, in which a listener positioned straight in front of the speakers will experience the audio differently than a listener positioned to the left or the right of the speakers. This phenomenon is particularly acute for audio frequencies around the center frequency $f_o$ (e.g., the frequency on which the spacing of the mid-range speakers is based). In some cases, certain frequencies are completely canceled out in some positions relative to the speaker. While this behavior may be desirable in some circumstances, such as when the MTM speakers are oriented vertically (which reduces reflections and/or echoes off of the ceilings and floors), such behavior may be undesirable in others, such as when the MTM speakers are oriented horizontally (which results in a limited range of positions in which the frequency response is consistent and the audio sounds substantially as intended). Unlike such known MTM speaker arrangements, the example zone players 602, 604 of FIG. 6 reduce or eliminate the narrowing phenomenon and increase the angular audibility range (e.g., the range of angles measured from straight in front of the speaker) in which the frequency response is consistent and the sounds from the speakers are heard substantially as intended.

In the example of FIG. 6, the audio filter 616 processes the audio based on the configuration of the zone player 602 in the stereo pair. In particular, the zone player 602 is set up as the left speaker (when viewing from the front). Additionally, the zone player 602 is configured with a horizontal orientation. Thus, the zone player 602 is aware that the speaker 606 is the left mid-range speaker and the speaker 608 is the right mid-range speaker for the left zone player 602 of the stereo pair (when viewing from the front). Based on this configuration information, the example audio filter 616 applies a first filtering configuration (e.g., the first mid-range filter 620) to the left (e.g., outer) mid-range speaker 606 and applies a second filtering configuration (e.g., the second mid-range filter 624) to the right (e.g., inner) mid-range speaker 608.

The example audio filter 618 also includes audio preprocessing 628, a first mid-range filter 630, a second mid-range filter 632, and a tweeter filter 634. Like the audio filter 616, the audio filter 618 applies the different filtering configurations to the example mid-range filters 610, 612 based on configuration information for the zone player 604 (e.g., physical orientation, status as right/left speaker of a stereo pair, etc.). In the example of FIG. 6, the audio filter 618 applies the first mid-range filter 630 to the right (e.g., outer) mid-range speaker 612 and applies the second mid-range filter 632 to the left (e.g., inner) mid-range speaker 610. The example audio filters 616, 618 result in the zone players 602, 604 steering audio and expanding the angular field of audibility relative to known MTM speakers.

Figure 7:
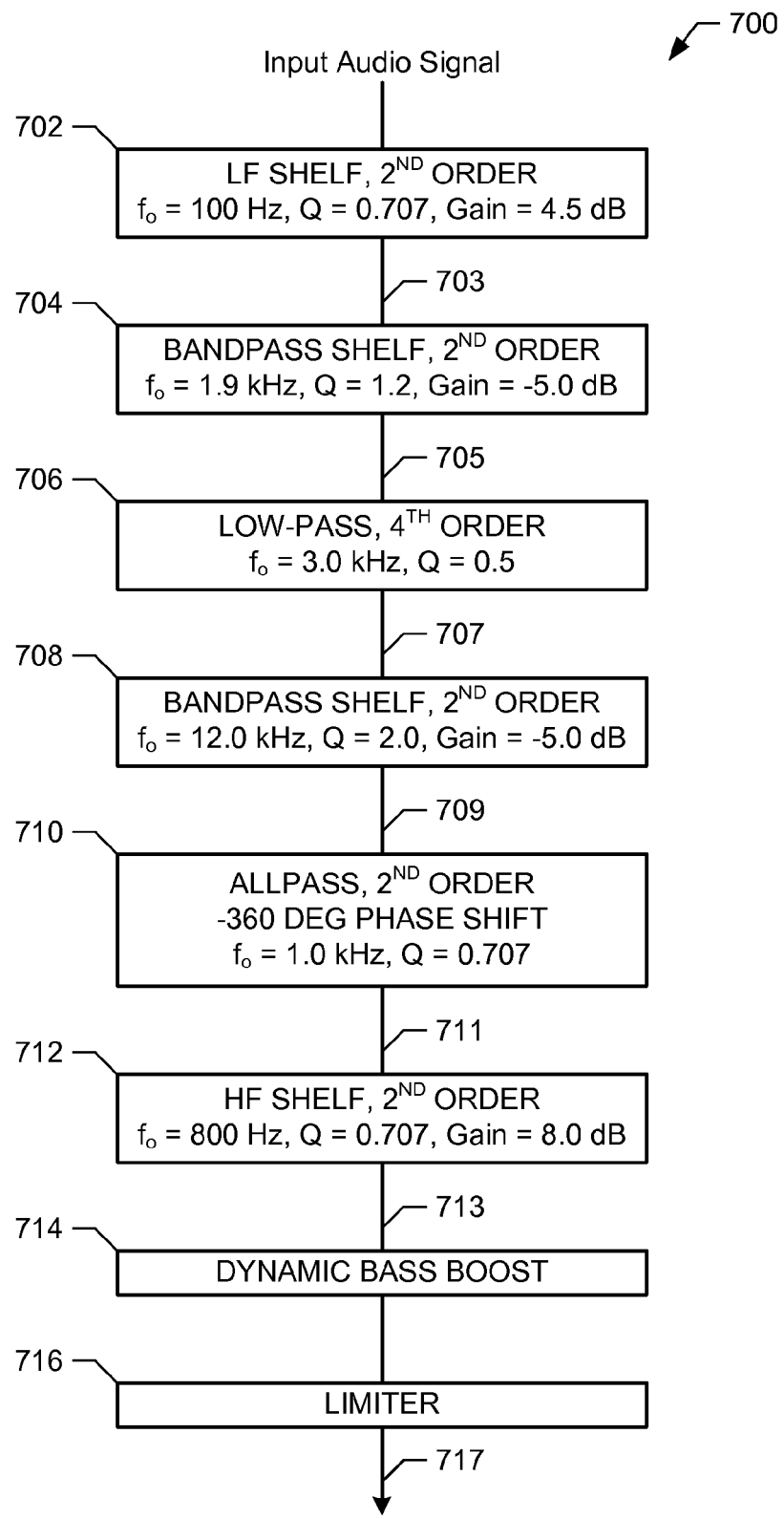
FIG. 7 shows a block diagram of an example audio filter to implement the first mid-range filter of FIG. 6.

FIG. 7 shows a block diagram of an example audio filter 700 to implement the first mid-range filters 622, 630 of FIG. 6. The example audio filter 700 of FIG. 7 receives an audio signal and outputs a filtered audio signal to a mid-range speaker (e.g., an outer mid-range speaker, the mid-range speakers 606, 612 of FIG. 6).

On receiving the input audio signal, a second-order low-frequency (LF) shelf filter 702 is applied. The example second-order LF shelf filter 702 has a cutoff frequency of 100 Hz, a quality factor (Q) of 0.707, and a gain of 4.5 dB, and increases the gain of the audio signal for frequencies below the cutoff frequency. The Q of a filter refers to the damping and/or resonance of a filter. The resulting signal 703 is then applied to a second-order bandpass shelf filter 704, which has a center frequency of 1.9 kHz, a Q of 1.2, and a gain of −5.0 dB. The bandpass shelf filter 704 attenuates a band of frequencies centered on 1.9 kHz. The signal 705 from the bandpass shelf filter 704 is input to a fourth-order low-pass filter 706, which has a cutoff frequency of 3.0 kHz and a Q of 0.5. The example low-pass filter 706 attenuates the signal for frequencies higher than 3.0 kHz. The signal 707 from the low-pass filter 706 is input to a second second-order bandpass shelf filter 708. The second bandpass shelf filter 708 has a center frequency 12.0 kHz, a Q of 2.0, and a gain of −5.0 dB, and therefore attenuates frequencies around the frequency 12.0 kHz.

The resulting signal 709 is input to a second-order allpass filter 710, which has a center frequency of 1.0 kHz and a Q of 0.707. The example allpass filter 710 does not substantially amplify or attenuate the signal, but applies a −360 degree phase shift to the signal 709 to generate a lagging signal 711. The phase shift applied by the allpass filter 710 may change for frequencies above and below the center frequency of 1.0 kHz. The lagging signal 711 is applied to a second-order high-frequency (HF) shelf filter 712, which has a cutoff frequency of 800 Hz, a Q of 0.707, and a gain of 8.0 dB. As explained below, the example HF shelf filter 712 provides amplification to the output of the example filter 700 to create a higher crossover frequency for the first mid-range filter 622 than for the second mid-range filter 624 of FIG. 6.

The example signal 713 from the HF shelf filter 712 is output to a dynamic bass boost filter 714 and a limiter 716. The example filter 700 outputs the filtered signal 717 to an amplifier (e.g., the amplifier 416) and/or to a mid-range speaker (e.g., the mid-range speaker 606).

While the example filter blocks 702-716 are shown in the order illustrated in FIG. 7, the blocks 702-716 may be applied in different ways to achieve identical, similar, or different filtering. Additionally, the example center and/or cutoff frequencies, Q values, and/or gains applied by the example filter blocks 702-716 may be modified to change a frequency response of the example audio filter 700.

In some examples, the second-order bandpass shelf filter 708, the second-order allpass filter 710, and/or the second-order HF shelf 712 blocks are omitted or skipped when a zone player 602, 604 is in a vertical orientation. In these examples, the audio filter 700 temporarily operates similar to the example second mid-range filters 624, 632 of FIG. 6 and the MTM narrowing phenomenon may be observed from the zone player 602, 604. In some examples, however, the mid-range filters 622, 624, 630, 632 are implemented using a different filter such as the example filter 1300 described below with reference to FIG. 13. The invocation of the example second-order bandpass shelf filter 708, the second-order allpass filter 710, and/or the second-order HF shelf 712 may be based on the configuration information (e.g., orientation, participation and/or position in a stereo pair, etc.) for the example zone player 602, 604.

Figure 8:
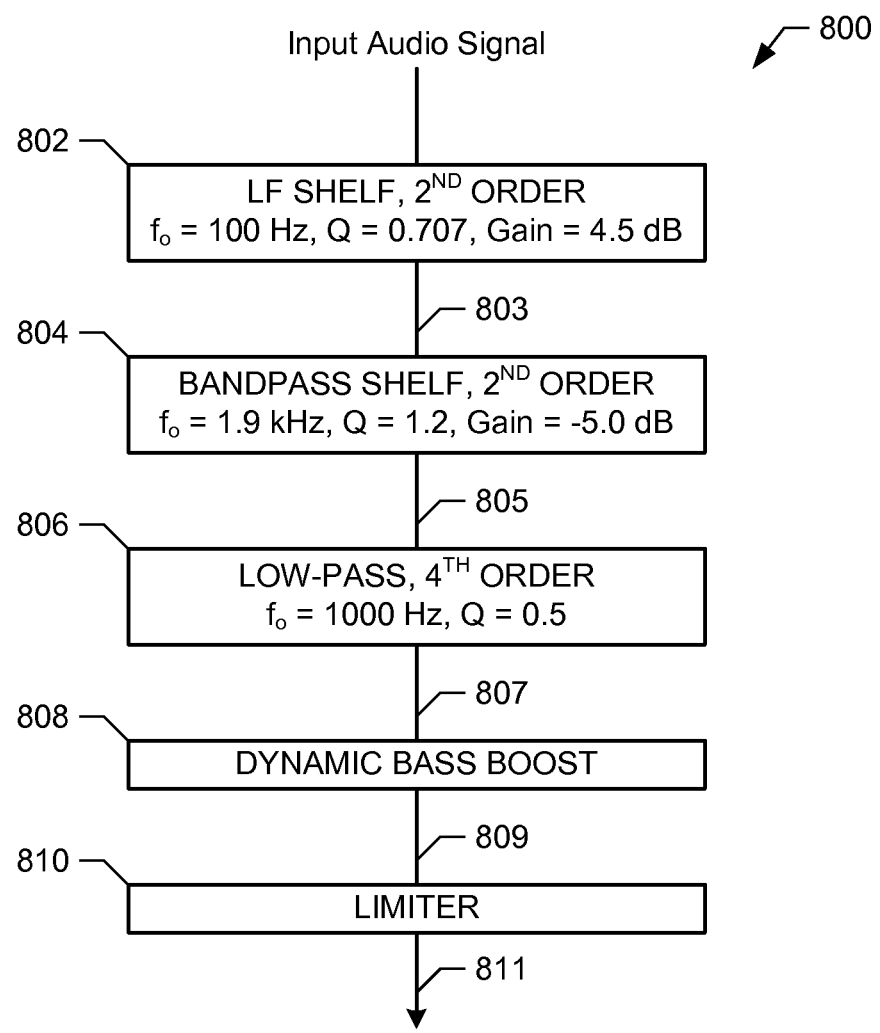
FIG. 8 shows a block diagram of an example audio filter to implement the second mid-range filter of FIG. 6.

FIG. 8 shows a block diagram of an example audio filter 800 to implement the second mid-range filters 624, 632 of FIG. 6. The example audio filter 800 of FIG. 8 receives an audio signal and outputs a filtered audio signal to an amplifier and/or to a mid-range speaker (e.g., the mid-range speakers 608, 614 of FIG. 6).

On receiving the input audio signal (e.g., the same audio signal received by the example filter 700 of FIG. 7 when the filters 700, 800 are implemented by the same zone player 602, 604), a second-order LF shelf filter 802 is applied. The example second-order LF shelf filter 702 has a cutoff frequency of 100 Hz, a Q of 0.707, and a gain of 4.5 dB, and increases the gain of the audio signal for frequencies below the cutoff frequency. Thus, the example LF shelf filter 802 performs substantially the same filtering as the LF shelf filter 702 of FIG. 7. In some examples, the LF shelf filters 702 and 802 may be combined, in which case the resulting signal is provided to the different first and second mid-range filters (e.g., the first and second mid-range filters 622, 624 of FIG. 6) for further processing.

Continuing with the example of FIG. 8, the signal 803 from the LF shelf filter 802 is then applied to a second-order bandpass shelf filter 804, which has a center frequency of 1.9 kHz, a Q of 1.2, and a gain of −5.0 dB. The bandpass shelf filter 804 attenuates a band of frequencies centered on 1.9 kHz. Thus, the example bandpass shelf filter 804 performs substantially the same filtering as the bandpass shelf filter 704 of FIG. 7. In some examples, the bandpass shelf filters 704 and 804 may be combined (e.g., additionally or alternatively to combining the LF shelf filters 702, 802), in which case the resulting signal from the combined bandpass shelf filter is provided to the different first and second mid-range filters (e.g., the first and second mid-range filters 622, 624 of FIG. 6) for further processing.

Continuing with the example of FIG. 8, the signal 805 from the bandpass shelf filter 804 is input to a fourth-order low-pass filter 806, which has a cutoff frequency of 1000 Hz and a Q of 0.5. The example low-pass filter 806 attenuates the signal for frequencies higher than 1000 Hz. The example signal 809 from the low-pass filter 806 is output to a dynamic bass boost filter 808 and a limiter 810. The example filter 800 outputs the filtered signal 811 to an amplifier (e.g., the amplifier 416) and/or to a mid-range speaker (e.g., the mid-range speaker 608).

Figure 9:
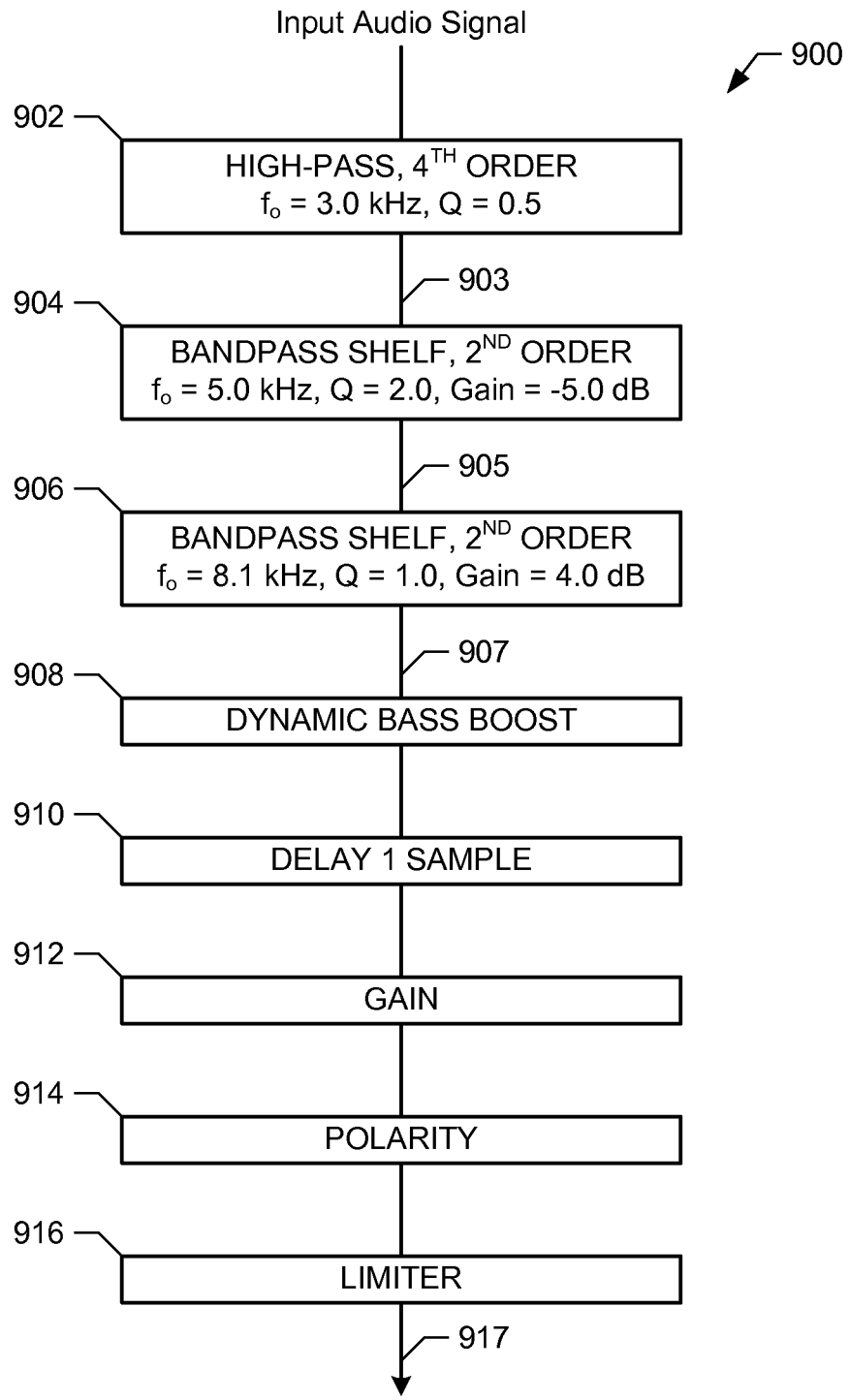
FIG. 9 shows a block diagram of an example audio filter to implement the tweeter filters of FIG. 6.

FIG. 9 shows a block diagram of an example audio filter 900 to implement the tweeter filters 626, 634 of FIG. 6. The example audio filter 900 of FIG. 9 receives an audio signal and outputs a filtered audio signal to a tweeter (e.g., the tweeters 614, 615 of FIG. 6).

On receiving the input audio signal (e.g., the same audio signal received by the example filters 700, 800 of FIGS. 7 and 8), a fourth-order high-pass filter 902 is applied. The example high-pass filter 902 has a cutoff frequency of 3.0 kHz and a Q of 0.5, and attenuates the input audio signal for frequencies lower than 3.0 kHz. The signal 903 output from the high-pass filter 902 is input to a first second-order bandpass shelf filter 904, which has a center frequency of 5.0 kHz, a Q of 2.0, and a gain of −5.0 dB. The first bandpass shelf filter 904 attenuates a band of frequencies centered on 5.0 kHz. The resulting signal 905 is input to a second second-order bandpass shelf filter 906. The example second bandpass shelf filter 906 has a center frequency of 8.1 kHz, a Q of 1.0, and a gain of 4.0 dB. Thus, the example bandpass shelf filter 906 amplifies a band of frequencies centered on 8.1 kHz.

The example signal 907 from the low-pass filter 906 is output to a dynamic bass boost filter 908, a 1-sample delay 910, a signal amplifier (gain) 912 and a limiter 914 The example filter 900 outputs the filtered signal 917 to an amplifier (e.g., the amplifier 416) and/or to a mid-range speaker (e.g., the tweeter 614 of FIG. 6).

Any or all of the example filters 700, 800, 900 of FIGS. 7-9 may be implemented using one or more digital audio processors, discrete digital and/or audio components, and/or any other type of logic circuit and/or analog filters.

Figure 10:
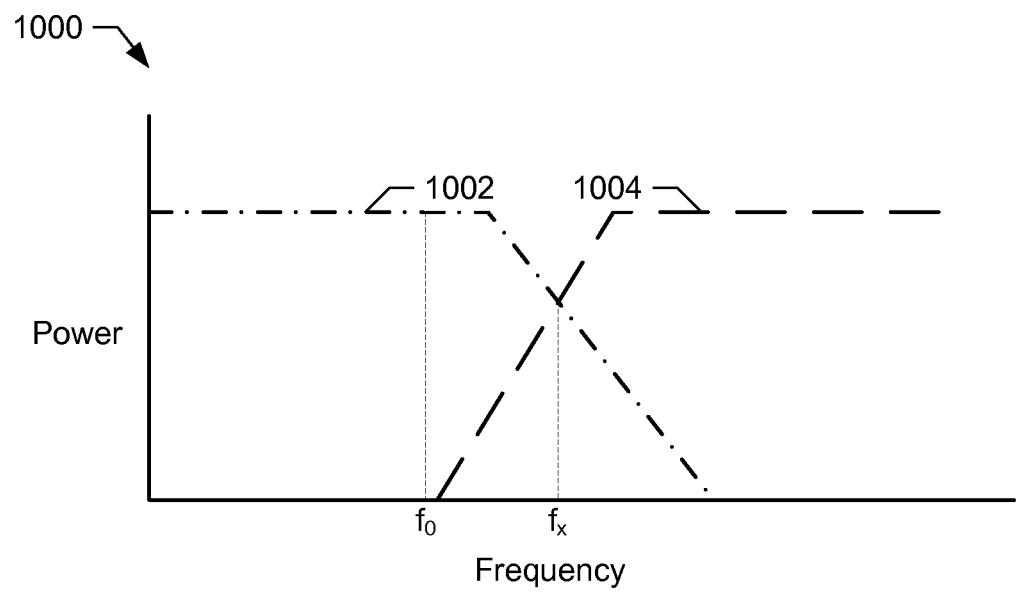
FIG. 10 shows a simplified frequency response of a known MTM speaker arrangement.

FIG. 10 shows a simplified frequency response 1000 of a known MTM speaker arrangement. The frequency response 1000 of FIG. 10 includes a mid-range response 1002 (representative of the mid-range speakers) and a high-range frequency response 1004 (representative of the tweeter). At a crossover frequency $f_x$, the mid-range response 1002 and the high-range response 1004 are substantially equal. The mid-range response 1002 dominates in audio frequencies below the crossover frequency $f_x$ and the high-range response 1004 dominates in audio frequencies above the crossover frequency $f_x$. As a result, the $\lambda_0/2$ distance between the mid-range speakers causes destructive interference to occur for frequencies around the center frequency $f_0$ outside of an angular audibility range. The destructive interference causes substantial changes in the objective and subjective perceptions of the audio between different physical locations inside and outside of the angular audibility range.

Figure 11:
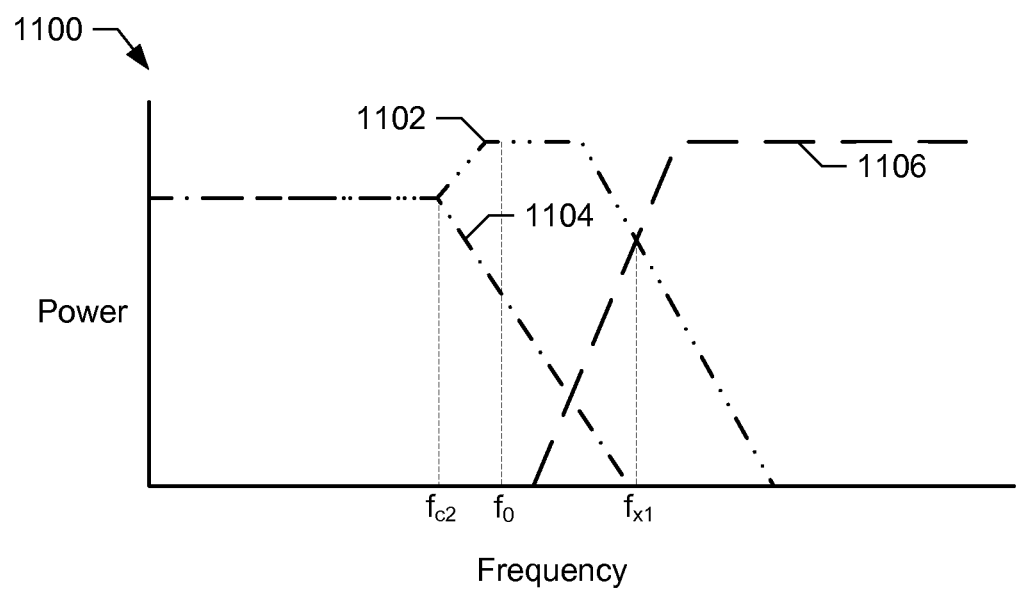
FIG. 11 shows a simplified frequency response of an example apparatus using the example audio filters of FIGS. 7-9.

FIG. 11 shows a simplified frequency response 1100 of the example apparatus (e.g., the zone player 602, 604 of FIG. 6) using the example audio filters of FIGS. 7-9. The example zone player 602, 604 of FIG. 6 reduces or avoids the destructive interference experienced by known MTM speaker arrangements, thereby increasing the angular audibility range and decreasing distortion of the audio between different physical locations.

The example frequency response 1100 includes a first mid-range frequency response 1102, a second mid-range frequency response 1104, and a high-range frequency response 1106. The example first mid-range frequency response 1102 corresponds to the mid-range speaker(s) coupled to the first mid-range filters of FIG. 6 (e.g., the mid-range speakers 606, 612). The example second mid-range frequency response 1104 corresponds to the mid-range speaker(s) coupled to the second mid-range filters of FIG. 6 (e.g., the midrange speakers 608, 610). The example high-range frequency response 1106 corresponds to the tweeters 614, 615.

As illustrated in FIG. 11, the mid-range frequency responses 1102, 1104 have different crossover frequencies. The cutoff frequency $f_{c2}$ for the example second mid-range response 1104 is lower than the center frequency $f_0$ on which the mid-range speaker spacing is based. Therefore, at frequencies around the center frequency $f_0$, the first mid-range speakers 606, 612 has the dominant response and the destructive interference is substantially reduced. As used herein, a dominant response refers to a first frequency response being substantially stronger (e.g., 3 dB greater or more) than a second frequency response. As a result, the frequencies around the center frequency $f_0$ have reduced or eliminated interference outside of the angular audibility range. The combination of responses 1102, 1104 and the response 1106 have a crossover frequency of $f_{x1}$, which in some examples is higher than the crossover frequency $f_x$ of known MTM crossover frequencies.

The example frequency response 1100 of FIG. 11 is achieved by filtering the signal to the first mid-range speakers 606, 612 using the fourth-order low-pass filter 706, the allpass filter (e.g., allpass filter block 710 of FIG. 7) and the HF shelf filter (e.g., the second-order HF shelf filter 712). The example low-pass filter 706 has an increased cutoff frequency relative to known MTM crossover filters and relative to the low-pass filter 806 used in the example second mid-range filter 800. As a result, the attenuation of the 1000 Hz-3.0 kHz frequency range is reduced or avoided by the signal to the first mid-range speakers 606, 612 and applied to the signal to the second mid-range speakers 608, 610.

The example HF shelf filter 712 of FIG. 7 provides additional gain for the first mid-range speakers 606, 612 above the cutoff frequency $f_{c2}$ of the response. Because the second mid-range speakers 608, 610 are substantially attenuated above the cutoff frequency $f_{c2}$ (e.g., 1000 Hz-3.0 kHz), the first mid-range filter 700 includes the example HF shelf filter 712 to provide a more consistent response for the frequencies provided by the mid-range speakers 606, 612. In contrast, if the HF shelf filter 712 was not present (or not used), the frequencies above the cutoff frequency $f_{c2}$ would sound substantially attenuated in every physical location.

The use of allpass filter in a first signal and omission in a second signal causes the example zone players 602, 604 to steer the audio outward. As used here, outward refers to steering the audio from the left zone player 602 toward the left and steering the audio from the right zone player 604 toward the right. Steering the audio further decreases the narrowing effect compared to known MTM speaker arrangements.

Figure 12:
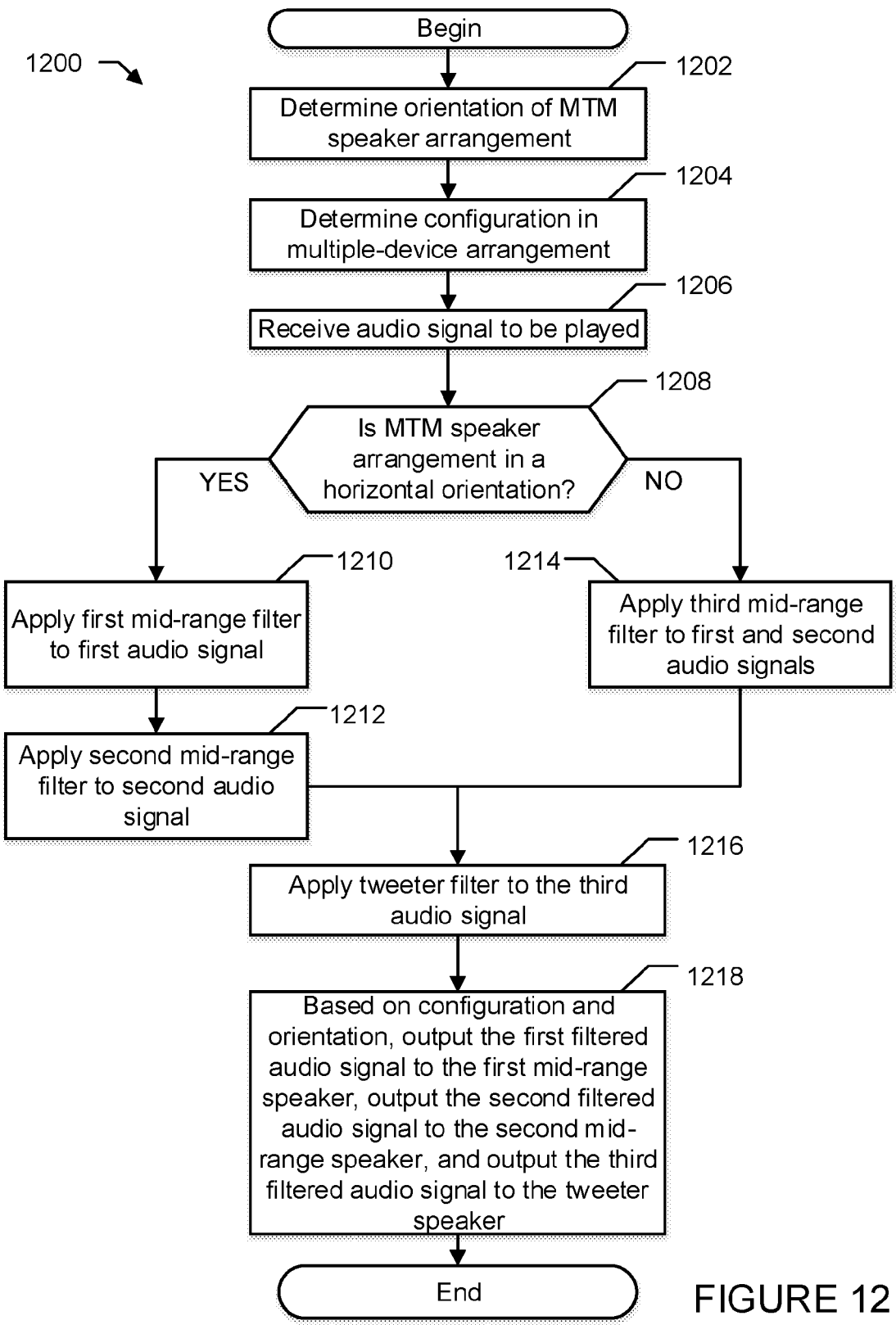
FIG. 12 is a flowchart representative of example method to implement the example apparatus and/or the example audio filters of FIGS. 4 and 6-8.

FIG. 12 is a flowchart representative of example method 1200 to implement the example zone players and/or the example audio filters of FIGS. 4 and 6-8. The example method 1200 may be used to provide an MTM speaker arrangement having improved audio characteristics in a horizontal orientation. The example method 1200 may be performed by a logic circuit such as a microprocessor, a digital audio processor, and/or any other type of logic circuit.

The example method 1200 begins by determining (e.g., via an orientation detector, the accelerometer 422 of FIG. 4) an orientation of an MTM speaker arrangement (e.g., the zone players 400, 602, 604 of FIGS. 4 and 6) (block 1202). For example, the accelerometer 422 determines whether the zone player 400, 602, 604 is in a vertical arrangement or a horizontal arrangement. The example method 1200 also determines (e.g., via the network interface 402, the processor 408, and/or the memory 410 of FIG. 4) a configuration of the zone player 400, 602, 604 in a multiple-device arrangement (block 1204). For example, the processor 408 may determine whether the zone player 400, 602, 604 is the left speaker or the right speaker of a stereo speaker arrangement.

The example method 1200 receives an audio signal to be played (block 1206). The example audio signal may be compressed and/or encoded audio from an audio source, or may be an uncompressed and/or decoded audio signal. The example method 1200 splits into two portions that may operate substantially simultaneously (e.g., via a multi-threading and/or multi-core processor) or sequentially. In a first branch, the zone player 400, 602, 604 determines whether it is in a horizontal orientation (block 1208). If the zone player 400, 602, 604 is in a horizontal orientation (block 1208), a first audio filter (e.g., the example audio processing circuit 412 of FIG. 4, the example audio filters 616, 618 via the first mid-range filter 622, 630, 700 of FIGS. 6 and 7) is applied to the first audio signal (block 1210). For example, the audio processing circuit 412 may apply the first mid-range filter 700 of FIG. 7 to the second audio signal. An example second audio filter (e.g., the example audio processing circuit 412 of FIG. 4, the example audio filters 616, 618 via the second mid-range filter 624, 632, 800 of FIGS. 6 and 8) is applied to the second audio signal (block 1212). For example, the audio processing circuit 412 may apply the second mid-range filter 800 of FIG. 8 to the second audio signal.

After applying the appropriate filters to the first and second audio signals (blocks 1208-1214), the example method 1200 applies a tweeter filter (e.g., the tweeter filter 626, 634 of FIG. 6) to a third audio signal (block 1216). Based on the configuration (e.g., left/right speaker in a multiple-device arrangement) and/or the orientation (e.g., horizontal or nonhorizontal orientation), the example method 1200 outputs the first filtered audio signal to the first mid-range speaker (e.g., the first mid-range speakers 606, 612 of FIG. 6), outputs the second filtered audio signal to the second mid-range speaker (e.g., the first mid-range speakers 608, 610), and outputs the third filtered audio signal to the tweeter speaker (e.g., the tweeter speakers 614, 615) (block 1218). Thus, when the example zone player 400, 602, 604 is in a horizontal orientation, the first and second mid-range speakers output audio signals that are filtered differently. For example, the frequency response of the first and second midrange speakers may be similar to the simplified frequency response illustrated in FIG. 11.

After applying the appropriate filters to the first and second audio signals (blocks 1208-1214), the example method 1200 applies a tweeter filter (e.g., the tweeter filter 626, 634 of FIG. 6) to a third audio signal (block 1216). Based on the configuration (e.g., left/right speaker in a multiple-device arrangement) and/or the orientation (e.g., horizontal or non-horizontal orientation), the example method 1200 outputs the first filtered audio signal to the first mid-range speaker (e.g., the first mid-range speakers 606, 612 of FIG. 6), outputs the second filtered audio signal to the second mid-range speaker (e.g., the first mid-range speakers 608, 610), and outputs the third filtered audio signal to the tweeter speaker (e.g., the tweeter speakers 614, 616) (block 1218). Thus, when the example zone player 400, 602, 604 is in a horizontal orientation, the first and second mid-range speakers output audio signals that are filtered differently. For example, the frequency response of the first and second mid-range speakers may be similar to the simplified frequency response illustrated in FIG. 11.

The example method 1200 may then end and/or iterate to output additional audio signals. The example method 1200 may monitor the orientation and/or the configuration of the example zone player 400, 602, 604 to change the filtering as appropriate.

Figure 13:
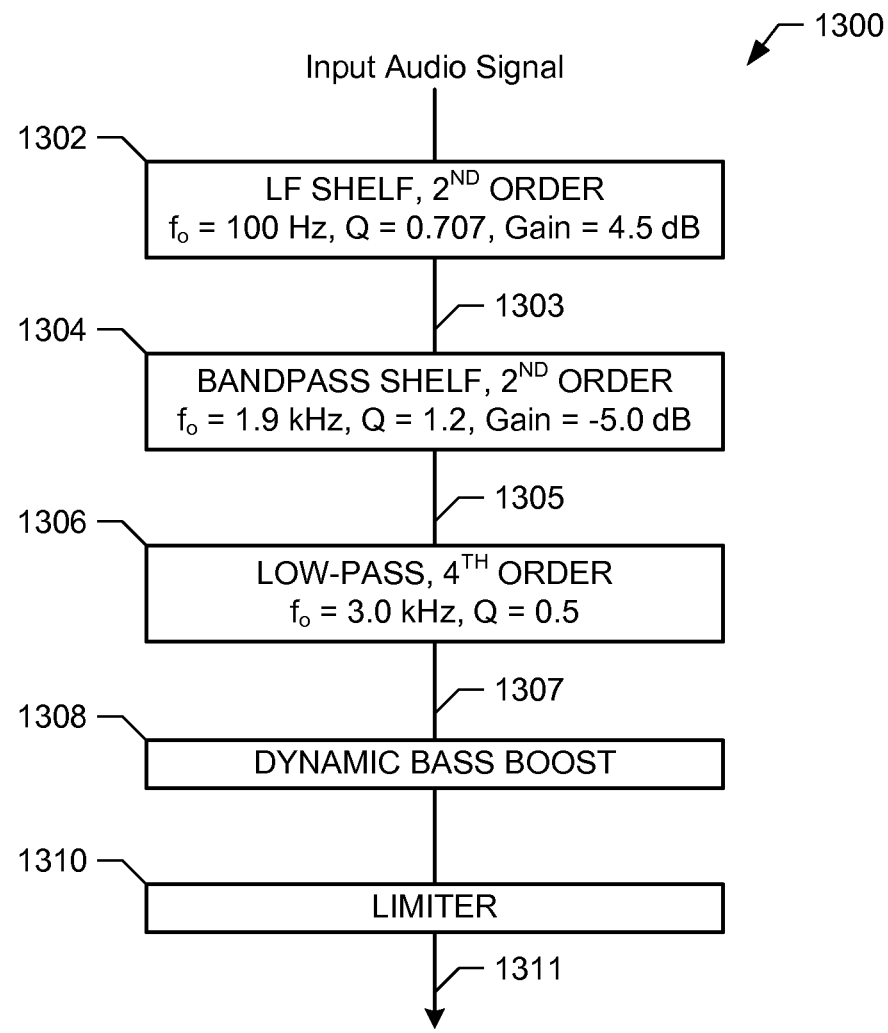
FIG. 13 shows a block diagram of an example audio filter to implement the first and second mid-range filters of FIG. 6.

FIG. 13 shows a block diagram of an example audio filter 1300 to implement the first and second mid-range filters 622, 624, 630, 632 of FIG. 6. The example audio filter 1300 of FIG. 13 receives an audio signal and outputs filtered audio signals to the mid-range speakers (e.g., an outer mid-range speaker, the mid-range speakers 606, 608, 610, 612 of FIG. 6). In particular, the example FIG. 13 may be used to filter audio signals when the MTM speakers 602, 604 of FIG. 6 are in a vertical orientation.

On receiving the input audio signal, a second-order low-frequency (LF) shelf filter 1302 is applied. The example second-order LF shelf filter 1302 has a cutoff frequency of 100 Hz, a quality factor (Q) of 0.707, and a gain of 4.5 dB, and increases the gain of the audio signal for frequencies below the cutoff frequency. The Q of a filter refers to the damping and/or resonance of a filter. The resulting signal 1303 is then applied to a second-order bandpass shelf filter 1304, which has a center frequency of 1.9 kHz, a Q of 1.2, and a gain of −5.0 dB. The bandpass shelf filter 1304 attenuates a band of frequencies centered on 1.9 kHz. The signal 1305 from the bandpass shelf filter 1304 is input to a fourth-order low-pass filter 706, which has a cutoff frequency of 3.0 kHz and a Q of 0.5. The example low-pass filter 1306 attenuates the signal for frequencies higher than 3.0 kHz. The signal 1307 from the low-pass filter 1306 is input from the low-pass filter 1306 to a dynamic bass boost filter 1308 and a limiter 1310. The example filter 1300 outputs the filtered signal 1311 to an amplifier (e.g., the amplifier 416) and/or to a mid-range speaker (e.g., the mid-range speaker 606).

While the example filter blocks 1302-1310 are shown in the order illustrated in FIG. 13, the blocks 1302-1310 may be applied in different ways to achieve identical, similar, or different filtering. Additionally, the example center and/or cutoff frequencies, Q values, and/or gains applied by the example filter blocks 1302-1310 may be modified to change a frequency response of the example audio filter 1300.

In view of the foregoing, it should be apparent that disclosed example systems, methods, and apparatus can be used to provide an MTM speaker arrangement having improved audio quality and perception. Example systems, methods, and apparatus apply different filtering to audio signals for output by different mid-range speakers based on the orientation of the MTM speaker arrangement and/or the configuration of the speakers in a multiple-device arrangement.

Various inventions have been described in sufficient detail with a certain degree of particularity. It is understood to those skilled in the art that the present disclosure of embodiments has been made by way of examples only and that numerous changes in the arrangement and combination of parts can be resorted without departing from the spirit and scope of the present disclosure as claimed. While the embodiments discussed herein can appear to include some limitations as to the presentation of the information units, in terms of the format and arrangement, the embodiments have applicability well beyond such embodiment, which can be appreciated by those skilled in the art. Accordingly, the scope of the present disclosure is defined by the appended claims rather than the forgoing description of embodiments.

The invention claimed is:

1. A method comprising:
   determining, by a playback device, that a physical orientation of a playback device is one of (a) a first physical orientation and (b) a second physical orientation, the playback device including a first speaker and a second speaker;
   configuring, by the playback device, the first speaker and the second speaker, wherein configuring the first and second speakers comprises:
   when the determined physical orientation is the first physical orientation, configuring, by the playback device, a first audio filter to be applied to a first audio signal for the first speaker and configuring a second audio filter to be applied to a second audio signal for the second speaker, wherein the first audio filter and the second audio filter cause a first frequency response of the first speaker to dominate a second frequency response of the second speaker in a frequency range, wherein a third speaker is in between the first speaker and the second speaker, and wherein the frequency range is based on a distance between the first speaker and the second speaker; and,
   when the determined physical orientation is the second physical orientation, configuring, by the playback device, a third audio filter to be applied to the first audio signal and the second audio signal; and
   facilitating playback of audio via the playback device according to the filtered first audio signal and the filtered second audio signal.

2. The method of claim 1, wherein the first physical orientation comprises a horizontal physical orientation and wherein the second physical orientation comprises a vertical physical orientation.

3. The method of claim 1, further comprising applying, by the playback device, a high-range filter to a third audio signal for the third speaker, wherein the third speaker is a high-range speaker, wherein the first speaker comprises a first mid-range speaker and the second speaker comprises a second mid-range speaker, and wherein the distance is between the first mid-range speaker and the second mid-range speaker.

4. The method of claim 3, wherein first mid-range speaker and the second mid-range speaker have same audio characteristics.

5. The method of claim 3, wherein the first mid-range speaker, the high-range speaker, and the second mid-range speaker are arranged in a mid-tweeter-mid speaker arrangement in the playback device.

6. The method of claim 3, wherein the first audio filter comprises a first crossover frequency with the high-range filter and a first cutoff frequency and the second audio filter comprises a second crossover frequency with the high-range filter and a second cutoff frequency; wherein the first frequency response of the first speaker dominates the second frequency response of the second audio speaker between the second cutoff frequency and the second crossover frequency.

7. The method of claim 1, wherein a cutoff frequency of the second audio filter is less than a center frequency, the center frequency being based on the distance between the first speaker and the second speaker; and wherein the frequency range is based on the center frequency.

8. The method of claim 1, wherein the second audio filter comprises a low-frequency shelf filter, a bandpass shelf filter, and a low-pass filter having a second cutoff frequency, and wherein the first audio filter comprises a low-frequency shelf filter, a bandpass shelf filter, a low-pass filter having a first cutoff frequency, an allpass filter, and a high-frequency shelf filter, wherein the first cutoff frequency of the low pass filter of the first audio filter is higher than the second cutoff frequency of the low pass filter of the second audio filter, and wherein the high-frequency shelf filter provides a gain above a cutoff frequency of the second audio filter.

9. A playback device comprising:
   a first speaker, a second speaker, and a third speaker;
   a physical orientation detector to determine that a physical orientation of the playback device is one of (a) a first physical orientation and (b) a second physical orientation; and
   a processor and memory including instructions which, when executed by the processor, configure the processor to:
   configure the first speaker and the second speaker, wherein configuring the first and second speakers comprises:
   when the determined physical orientation is the first physical orientation, the processor is to configure a first audio filter to be applied to a first audio signal for the first speaker and configure a second audio filter to be applied to a second audio signal for the second speaker, wherein the first audio filter and the second audio filter cause a first frequency response of the first speaker to dominate a second frequency response of the second speaker in a frequency range, wherein the third speaker is in between the first speaker and the second speaker, and wherein the frequency range is based on a distance between the first speaker and the second speaker; and,
   when the physical orientation is the second physical orientation, the processor is to configure a third audio filter to be applied to the first audio signal and the second audio signal; and facilitate playback of audio via the playback device according to the filtered first audio signal and the filtered second audio signal.

10. The playback device of claim 9, wherein the first physical orientation comprises a horizontal physical orientation and wherein the second physical orientation comprises a vertical physical orientation.

11. The playback device of claim 9, wherein the third speaker is a high-range speaker, the high-range speaker to be configured by applying a high-range filter to a third audio signal for the high-range speaker, wherein the first speaker comprises a first mid-range speaker and the second speaker comprises a second mid-range speaker, and wherein the distance is between the first mid-range speaker and the second mid-range speaker.

12. The playback device of claim 11, wherein first mid-range speaker and the second mid-range speaker have same audio characteristics.

13. The playback device of claim 11, wherein the first mid-range speaker, the high-range speaker, and the second mid-range speaker are arranged in a mid-tweeter-mid speaker arrangement in the playback device.

14. The playback device of claim 11, wherein the first audio filter comprises a first crossover frequency with the high-range filter and a first cutoff frequency and the second audio filter comprises a second crossover frequency with the high-range filter and a second cutoff frequency; wherein the first frequency response of the first speaker dominates the second frequency response of the second speaker between the second cutoff frequency and the second crossover frequency.

15. The playback device of claim 9, wherein a cutoff frequency of the second audio filter is less than a center frequency, the center frequency being based on the distance between the first speaker and the second speaker; and wherein the frequency range is based on the center frequency.

16. The playback device of claim 9, wherein the second audio filter comprises a low-frequency shelf filter, a bandpass shelf filter, and a low-pass filter having a second cutoff frequency, and wherein the first audio filter comprises a low-frequency shelf filter, a bandpass shelf filter, a low-pass filter having a first cutoff frequency, an allpass filter, and a high-frequency shelf filter, wherein the first cutoff frequency of the low pass filter of the first audio filter is higher than the second cutoff frequency of the low pass filter of the second audio filter, and wherein the high-frequency shelf filter provides a gain above a cutoff frequency of the second audio filter.

17. A non-transitory tangible computer readable storage medium including computer program instructions which, when executed by a processor, implement a method, the method comprising:

determining that a physical orientation of a playback device is one of (a) a first physical orientation and (b) a second physical orientation, the playback device including a first speaker and a second speaker;

configuring the first speaker and the second speaker, wherein configuring the first and second speakers comprises:

when the determined physical orientation is the first physical orientation, configuring a first audio filter to be applied to a first audio signal for the first speaker and configuring a second audio filter to be applied to a second audio signal for the second speaker, wherein the first audio filter and the second audio filter cause a first frequency response of the first speaker to dominate a second frequency response of the second speaker in a frequency range, wherein a third speaker is in between the first speaker and the second speaker, and wherein the frequency range is based on a distance between the first speaker and the second speaker; and, when the physical orientation is the second physical orientation, configuring a third audio filter to be applied to the first audio signal and the second audio signal; and facilitating playback of audio via the playback device according to the filtered first audio signal and the filtered second audio signal.

18. The non-transitory tangible computer readable storage medium of claim 17, wherein the first physical orientation comprises a horizontal physical orientation and wherein the second physical orientation comprises a vertical physical orientation.

19. The non-transitory tangible computer readable storage medium of claim 17, wherein the third speaker is a high-range speaker, the high-range speaker to be configured by applying a high-range filter to a third audio signal for the high-range speaker, wherein the first speaker comprises a first mid-range speaker and the second speaker comprises a second mid-range speaker, and wherein the distance is between the first mid-range speaker and the second mid-range speaker.

20. The non-transitory tangible computer readable storage medium of claim 19, wherein the first mid-range speaker, the high-range speaker, and the second mid-range speaker are arranged in a mid-tweeter-mid speaker arrangement in the playback device.

21. The non-transitory tangible computer readable storage medium of claim 19, wherein the first audio filter comprises a first crossover frequency with the high-range filter and a first cutoff frequency and the second audio filter comprises a second crossover frequency with the high-range filter and a second cutoff frequency; wherein the first frequency response of the first speaker dominates the second frequency response of the second speaker between the second cutoff frequency and the second crossover frequency.

22. The non-transitory tangible computer readable storage medium of claim 17, wherein a cutoff frequency of the second audio filter is less than a center frequency, the center frequency being based on the distance between the first speaker and the second speaker; and wherein the frequency range is based on the center frequency.

* * * * *